United States Patent
Cho

(10) Patent No.: US 11,201,305 B2
(45) Date of Patent: Dec. 14, 2021

(54) DISPLAY PANEL AND METHOD OF MANUFACTURING THE SAME

(71) Applicants: HKC Corporation Limited, Guangdong (CN); Chongqing HKC Optoelectronics Technology Co., Ltd., Chongqing (CN)

(72) Inventor: En-Tsung Cho, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 70 days.

(21) Appl. No.: 16/637,537

(22) PCT Filed: Sep. 21, 2017

(86) PCT No.: PCT/CN2017/102603
§ 371 (c)(1),
(2) Date: Feb. 7, 2020

(87) PCT Pub. No.: WO2019/028973
PCT Pub. Date: Feb. 14, 2019

(65) Prior Publication Data
US 2020/0259111 A1     Aug. 13, 2020

(30) Foreign Application Priority Data

Aug. 8, 2017  (CN) .......................... 201710669330.3

(51) Int. Cl.
*H01L 51/50* (2006.01)
*H01L 51/56* (2006.01)
(Continued)

(52) U.S. Cl.
CPC ............ *H01L 51/502* (2013.01); *H01L 51/56* (2013.01); *H01L 27/3244* (2013.01); *H01L 33/06* (2013.01); *H01L 33/34* (2013.01)

(58) Field of Classification Search
CPC ... H01L 51/502; H01L 51/56; H01L 27/3244; Y10S 977/778; Y10S 977/779;
(Continued)

(56) References Cited

U.S. PATENT DOCUMENTS 11,127,911 B2 *  9/2021  Cho ...................... H01L 51/502
2001/0038900 A1 * 11/2001  Todori .................. G02F 1/3556
428/64.4

(Continued)

FOREIGN PATENT DOCUMENTS

CN   105720176 A  *  6/2016  ............. H01L 33/54
CN   105733556 A       7/2016
(Continued)

OTHER PUBLICATIONS

Machine translation, Zhu, Chinese Pat. Pub. No. CN 205643763U, translation date: Jun. 12, 2021, Espacenet, all pages. (Year: 2021).*

*Primary Examiner* — Victoria K. Hall
(74) *Attorney, Agent, or Firm* — Muncy, Geissler, Olds & Lowe, P.C.

(57) ABSTRACT

A display panel comprises a substrate, active switches and light-emitting diodes formed on the substrate. The active switches are disposed between the substrate and the light-emitting diodes. Each light-emitting diode comprises a first electrode, a second electrode, and a quantum dot luminescent layer. The quantum dot luminescent layer comprises a mesoporous frame. The mesoporous frame adopts a self-assembling form, the mesoporous frame serves as a main material, and quantum dots are disposed in the mesoporous frame. The first electrode, the quantum dot luminescent layer and the second electrode are stacked in order. Since the (Continued)

quantum dots are disposed in the mesoporous frame, the sizes of the quantum dots and the uniformity of their arrangement are adjusted and controlled, the light-emitting diodes with different luminous colors depending on the sizes of the quantum dots are then adjusted.

6 Claims, 7 Drawing Sheets

(51) Int. Cl.
 *H01L 33/34* (2010.01)
 *H01L 33/06* (2010.01)
 *H01L 27/32* (2006.01)
(58) Field of Classification Search
 CPC ... Y10S 977/78; Y10S 977/774; C09K 11/02; C09K 11/025
 See application file for complete search history.

(56) References Cited

U.S. PATENT DOCUMENTS

| | | | |
|---|---|---|---|
| 2004/0016646 A1 | 1/2004 | Stucky et al. | |
| 2008/0121955 A1* | 5/2008 | Shieh | H01L 21/0262 257/295 |
| 2009/0130422 A1* | 5/2009 | Martin | H01B 1/20 428/304.4 |
| 2009/0263956 A1* | 10/2009 | Amirav | B82Y 30/00 438/478 |
| 2010/0213440 A1* | 8/2010 | Shieh | H01L 31/035254 257/20 |
| 2012/0115767 A1* | 5/2012 | van Buskirk | C11D 3/3956 510/303 |
| 2013/0112613 A1* | 5/2013 | Kang | B01D 67/003 210/500.21 |
| 2013/0281315 A1* | 10/2013 | Sandros | G01N 33/588 506/9 |
| 2013/0303766 A1 | 11/2013 | Ha et al. | |
| 2015/0187987 A1* | 7/2015 | Sim | G02F 1/133602 257/98 |
| 2016/0084476 A1* | 3/2016 | Koole | B05D 1/18 362/84 |
| 2016/0122186 A1* | 5/2016 | Jafari | B01D 53/02 95/136 |
| 2016/0129388 A1* | 5/2016 | Singh | B01J 20/28064 95/136 |
| 2017/0153382 A1* | 6/2017 | Wang | C09K 11/025 |
| 2017/0221969 A1* | 8/2017 | Steckel | H01L 27/3211 |
| 2017/0243916 A1* | 8/2017 | Zhu | C09K 11/08 |
| 2018/0331312 A1* | 11/2018 | Pan | H01L 51/0005 |
| 2019/0016952 A1* | 1/2019 | Qiu | C09K 11/02 |
| 2019/0112527 A1* | 4/2019 | Moriyama | C09K 11/025 |

FOREIGN PATENT DOCUMENTS

| | | | | |
|---|---|---|---|---|
| CN | 205643763 U | * | 10/2016 | ............ G02B 6/00 |
| CN | 205643763 U | | 10/2016 | |
| CN | 106486510 A | | 3/2017 | |

* cited by examiner

DISPLAY PANEL AND METHOD OF MANUFACTURING THE SAME

BACKGROUND

Technical Field

This disclosure relates to a technical field of a display, and more particularly to a display panel and a method of manufacturing the same.

Related Art

The display has many advantages, such as the slim body, the power-saving property, the radiationless property and the like, and has been widely used. Most of the displays in the existing market are backlight displays, which include a display panel and a backlight module. The working principle of the display panel is to refract the light rays from the backlight module to produce a frame by placing liquid crystal molecules in two parallel substrates, and by applying a driving voltage to the two substrates to control the orientations of the liquid crystal molecules.

A thin film transistor-liquid crystal display (TFT-LCD) has the low power consumption, excellent frame quality and high production yield and other performances, and has now gradually occupied the dominant position in the display field. Similarly, the TFT-LCD includes the display panel and the backlight module. The display panel includes a color filter substrate (CF substrate, also referred to as a color filter substrate) and a thin film transistor substrate (TFT substrate), and the transparent electrode is present on the opposite inner sides of the above-mentioned substrates. A layer of liquid crystal (LC) molecules is disposed between the two substrates.

However, the TFT-LCD has the defects of the low image and color readability, the technical field of the display has the high innovation speed, the larger viewing angle, the high contrast ratio, the lighter weight and the thinner thickness, and the active lighting OLED can enter the technical competition of display. However, because a lot of organic materials are used, the reliability problem of OLED becomes an insurmountable gap, and the high cost disables the OLED from being applied to the large-screen wide application.

SUMMARY

The technical problem to be solved by this disclosure is to provide a display panel with the uniform luminous color.

In addition, this disclosure further provides a display device.

A display panel comprises a substrate, active switches and light-emitting diodes formed on the substrate. The active switches are disposed between the substrate and the light-emitting diodes. Each light-emitting diode comprises a first electrode, a second electrode, and a quantum dot luminescent layer. The quantum dot luminescent layer comprises a mesoporous frame. The mesoporous frame adopts a self-assembling form, the mesoporous frame serves as a main material, and quantum dots are disposed in the mesoporous frame. The first electrode, the quantum dot luminescent layer and the second electrode are stacked in order.

A pore is formed in the mesoporous frame, the quantum dots are filled within the pore. The organic molecular template has a very good shaping effect, so that the quantum dots are spread in the gap provided between the organic molecular template and an inner wall of the pore more uniformly.

The radii of the quantum dots are smaller than or equal to the exciton Bohr radius. Since the radii are smaller than or equal to the exciton Bohr radius of the material, the quantum dots have the very significant quantum confinement effect. In the quantum dots with the smaller physical sizes, since the motion of the carriers in each direction is limited, the original continuous bandgap structure becomes the quasi-discrete level, the effective bandgap of the material is increased, and the photons with the higher energy and shorter wavelengths are further radiated. It is not difficult to see that with the continuous reduction of the physical size of the quantum point, the emitted spectrum of the quantum points of the same material can achieve the transition from red to blue light, and this also creates the most compelling property of quantum dots (i.e., the spectrum tunability). In addition, the emitted spectrum of the quantum dots has the narrower half peak width, and has a good color purity and color saturation. Also, the quantum dot is an inorganic semiconductor material, and has the environment stability that the organic chromophore cannot be matched.

The quantum dot is a silicon nanometer crystal. Here is a material option for quantum dots.

The mesoporous frame is a self-assembling mesoporous silicon dioxide frame. This is a specific silicon dioxide frame structure, and the pore structure is adopted to conveniently adopt the implementation of the self-assembling molecule template solution oxide.

An inner wall of the pore is a silicon dioxide hole wall. Here is a material option for the hole wall.

A diameter of the pore ranges from 2 to 10 nanometers. This is a more preferred pore size.

The display panel includes the vacuum layer and the sealing portion, the sealing portion and the light-emitting diode cooperate with each other to form the vacuum layer, and the vacuum layer is disposed on the light-emitting diode. Here is the specific structure composition of the display panel.

In addition, the disclosure also provides a display panel, which comprises a substrate, active switches and light-emitting diodes formed on the substrate. The active switches are disposed between the substrate and the light-emitting diodes. Each light-emitting diode comprises a first electrode, a second electrode, and a quantum dot luminescent layer. The quantum dot luminescent layer comprises a mesoporous frame. The mesoporous frame adopts a self-assembling form, the mesoporous frame serves as a main material, quantum dots are disposed in the mesoporous frame, and the mesoporous frame is a self-assembling mesoporous silicon dioxide frame. The display panel comprises a vacuum layer and a sealing portion. The sealing portion and the light-emitting diode cooperate with each other to form the vacuum layer, and the vacuum layer is disposed on the light-emitting diode. The first electrode, the quantum dot luminescent layer and the second electrode are stacked in order. The self-assembling mesoporous silicon dioxide frame is formed with a pore, an inner wall of the pore is a silicon dioxide hole wall, a diameter of the pore ranges from 2 to 10 nanometers, and the quantum dots are filled within the pore. The radii of the quantum dots are smaller than or equal to an exciton Bohr radius. The material of the quantum dots is a silicon nanometer crystal.

In addition, the disclosure further provides a method of manufacturing a display panel, comprising steps of: providing a substrate; forming a first electrode on the substrate;

forming a quantum dot luminescent layer on the first electrode; and forming a second electrode on the quantum dot luminescent layer. The step of forming the quantum dot luminescent layer on the first electrode comprises: forming a mesoporous frame, wherein the mesoporous frame adopts a self-assembling form, the mesoporous frame serves as a main material, and a pore is formed in the mesoporous frame; filling an organic molecular template into the pore, wherein a gap is formed between the organic molecular template and an inner wall of the pore; injecting hydrogen into the gap; and injecting silicon tetrahydride into the gap. The organic molecular template, the hydrogen and the silicon tetrahydride are mixed to form quantum dots of a silicon nanometer crystal material.

In one embodiment, the step of forming the first electrode, the quantum dot luminescent layer and the second electrode adopts a solution processing.

In this disclosure, since the quantum dots are disposed in the mesoporous frame, the sizes of the quantum dots and the uniformity of their arrangement are adjusted and controlled, the light-emitting diodes with different luminous colors depending on the sizes of the quantum dots are then adjusted. Thus, it is possible to realize the regulation uniformity of the light with different luminous colors in the active luminous display panel, and enhance the display taste and the user's visual experience.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

Figure 1:
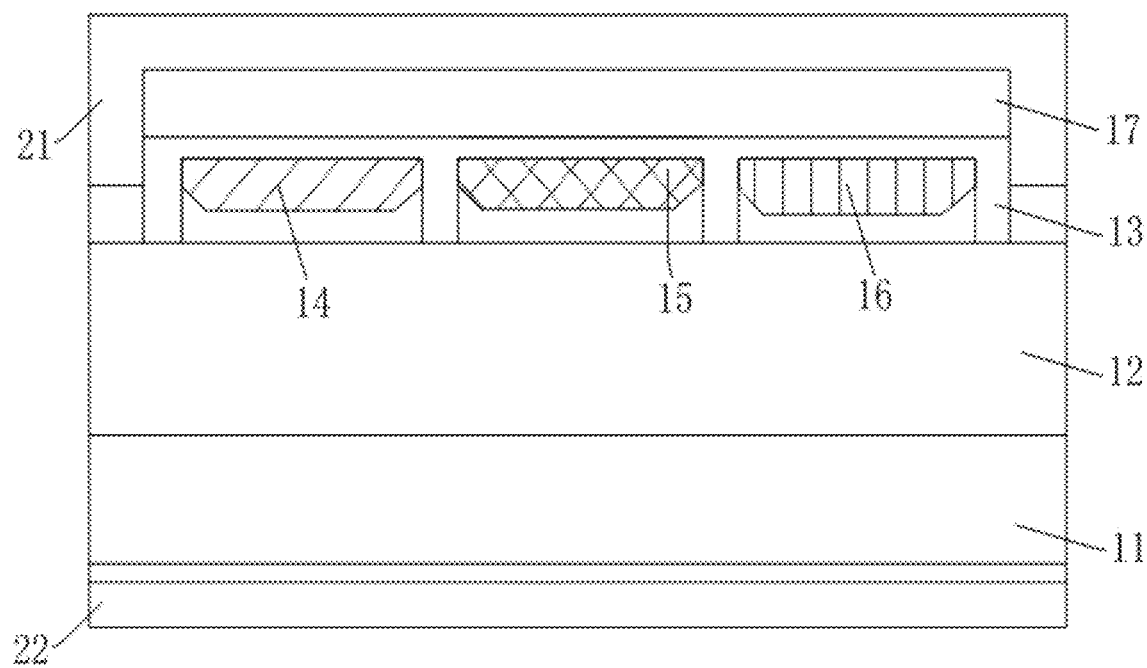
FIG. 1 is a schematic structure view showing a display panel of an embodiment of this disclosure.

Specific structures and function details disclosed herein are only for the illustrative purpose for describing the exemplary embodiment of this disclosure. However, this disclosure can be specifically implemented through many replacements, and should not be explained as being restricted to only the embodiment disclosed herein.

In the description of this disclosure, it is to be understood that the terms "center", "transversal", "up," "down," "left," "right," "vertical", "horizontal", "top," "bottom," "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure. In addition, the terms "first," and "second" are used for the illustrative purpose only and cannot be understood as indicating or implying the relative importance or implicitly specifying the number of indicated technical features. Therefore, the features restricted by "first" and "second" may expressly or implicitly comprise one or multiple ones of the features. In the description of this disclosure, unless otherwise described, the meaning of "multiple" comprises two or more than two. In addition, the terms "comprises" and any modification thereof intend to cover the non-exclusive inclusions.

In the description of this disclosure, it needs to be described that, unless otherwise expressly stated and limited, the terms "mount," "link" and "connect" should be broadly understood. For example, they may be the fixed connection, may be the detachable connection or may be the integral connection; may be the mechanical connection or may also be the electrical connection; or may be the direct connection, may be the indirect connection through a middle medium or may be the inner communication between two elements. It will be apparent to those skilled in the art that the specific meanings of the above terms in this application may be understood according to the specific conditions.

The terms used herein are for the purpose of describing only specific embodiments and are not intended to limit the exemplary embodiments. Unless the contexts clearly indicate otherwise, the singular form "one," "a" and "an" used here further intend to include plural forms. It should also be understood that the terms "comprising" and/or "including" are used herein to describe the features to describe the presence of stated features, integers, steps, operations, units and/or elements without excluding the presence or addition of one or more other features, integers, steps, operations, units, elements, and/or combinations thereof.

This disclosure is further described below with reference to the accompanying drawings and examples.

The schematic structure views showing a display panel of an embodiment of this disclosure will be described with reference to FIGS. 1 to 6.

As an embodiment of the present application, as shown in FIGS. 1 to 3 and 5, the display panel includes a substrate 11 and light-emitting diodes formed on the substrate 11; each of the light-emitting diodes includes a first electrode, a quantum dot luminescent layer and a second electrode; the first electrode, the quantum dot luminescent layer and the second electrode are stacked in order, and the quantum dot luminescent layer includes a mesoporous frame; the mesoporous frame adopts a self-assembling form, the mesoporous frame serves as a main material, and quantum dots 20 are disposed in the mesoporous frame. Since the quantum dots are disposed in the mesoporous frame, the sizes of the quantum dots and the uniformity of their arrangement are adjusted and controlled, the light-emitting diodes with different luminous colors depending on the sizes of the quantum dots are then adjusted. Thus, it is possible to realize the regulation uniformity of the light with different luminous colors in the active luminous display panel, and enhance the display taste and the user's visual experience.

As another embodiment of the present application, as shown in FIGS. 1 to 3 and 5, the display panel includes a substrate 11 and light-emitting diodes formed on the substrate 11; each of the light-emitting diode includes a first electrode, a quantum dot luminescent layer and a second electrode; the first electrode, the quantum dot luminescent layer and the second electrode are stacked in order, and the quantum dot luminescent layer includes a mesoporous frame; the mesoporous frame adopts a self-assembling form, the mesoporous frame serves as a main material, and quantum dots 20 are disposed in the mesoporous frame. Since the quantum dots are disposed in the mesoporous frame, the sizes of the quantum dots and the uniformity of their arrangement are adjusted and controlled, the light-emitting diodes with different luminous colors depending on the sizes of the quantum dots are then adjusted. Thus, it is possible to realize the regulation uniformity of the light with different luminous colors in the active luminous display panel, and enhance the display taste and the user's visual experience. The display panel includes the active switches 12, and the active switches 12 are disposed between the substrate 11 and the light-emitting diodes; and the display panel includes a vacuum layer 17 and a sealing portion 21, the sealing portion 21 and the light-emitting diode cooperate with each other to form the vacuum layer 17, and the vacuum layer 17 is disposed on the light-emitting diode.

A pore is formed in the mesoporous frame, an organic molecular template 19 is disposed inside the pore, and a gap is formed between the organic molecular template 19 and an inner wall of the pore; and the quantum dots 20 are disposed in the gap. The organic molecular template has a very good shaping effect, so that the quantum dots are spread in the gap provided between the organic molecular template and an inner wall of the pore more uniformly. The radii of the quantum dots are smaller than or equal to the exciton Bohr radius. Since the radii are smaller than or equal to the exciton Bohr radius of the material, the quantum dots have the very significant quantum confinement effect. In the quantum dots with the smaller physical sizes, since the motion of the carriers in each direction is limited, the original continuous bandgap structure becomes the quasi-discrete level, the effective bandgap of the material is increased, and the photons with the higher energy and shorter wavelengths are further radiated. It is not difficult to see that with the continuous reduction of the physical size of the quantum point, the emitted spectrum of the quantum points of the same material can achieve the transition from red to blue light, and this also creates the most compelling property of quantum dots (i.e., the spectrum tunability). In addition, the emitted spectrum of the quantum dots has the narrower half peak width, and has a good color purity and color saturation. Also, the quantum dot is an inorganic semiconductor material, and has the environment stability that the organic chromophore cannot be matched. The material of the quantum dots is a silicon nanometer crystal material formed by mixing the organic molecular template, the hydrogen and the silicon tetrahydride together.

As shown in FIG. 1, the light-emitting diodes are disposed on a luminous layer 13, the luminous layer 13 includes a first luminous portion 14, a second luminous portion 15 and a third luminous portion 16. The first luminous portion 14, the second luminous portion 15 and the third luminous portion 16 may correspondingly output red, green and blue light, respectively. Of course, the luminous color is not restricted thereto. An active switch 12 may adopt a thin film transistor disposed and used. In the luminous process of the luminous layer in the display panel: a battery or power of the display panel applies a voltage on two ends of the luminous layer; a current flows from the second electrode to the first electrode, and flows through the quantum dot luminescent layer; the second electrode outputs electrons to an emissive layer; the first electrode absorbs electrons from a conductive layer (this can be regarded as the first electrode outputting holes to the conductive layer, and the two effects are equivalent); at the junction between the emissive layer and the conductive layer, the electrons combine with the holes; when the electrons meet the holes, they can fill the holes; when this process occurs, the electrons release energy in the form of photons; and the display panel emits the light. The electrons and holes are injected into the quantum dot luminescent layer through the electron transport layer and the hole transport layer, respectively, and thus form the exciton composite luminescence. This process is the direct injection of charges, it can effectively weaken the energy loss caused by the photoluminescence process, and it is beneficial to further enhance the luminous efficiency. Meanwhile, the solution method process having the low cost and prepared in large area can be used.

As an embodiment of the present application, as shown in FIGS. 1 to 3 and 5, the display panel includes a substrate 11 and light-emitting diodes formed on the substrate 11; each of the light-emitting diode includes a first electrode, a quantum dot luminescent layer and a second electrode; the first electrode, the quantum dot luminescent layer and the second electrode are stacked in order, and the quantum dot luminescent layer includes a mesoporous frame; the mesoporous frame adopts a self-assembling form, the mesoporous frame serves as a main material, and quantum dots 20 are disposed in the mesoporous frame. Since the quantum dots are disposed in the mesoporous frame, the sizes of the quantum dots and the uniformity of their arrangement are adjusted and controlled, the light-emitting diodes with different luminous colors depending on the sizes of the quantum dots are then adjusted. Thus, it is possible to realize the regulation uniformity of the light with different luminous colors in the active luminous display panel, and enhance the display taste and the user's visual experience. The display panel includes the active switches 12, and the active switches 12 are disposed between the substrate 11 and the light-emitting diodes; and the display panel includes a vacuum layer 17 and a sealing portion 21, the sealing portion 21 and the light-emitting diode cooperate with each other to form the vacuum layer 17, and the vacuum layer 17 is disposed on the light-emitting diode.

A pore is formed in the mesoporous frame, an organic molecular template 19 is disposed inside the pore, and a gap is formed between the organic molecular template 19 and an inner wall of the pore; and the quantum dots 20 are disposed in the gap.

Figure 2:
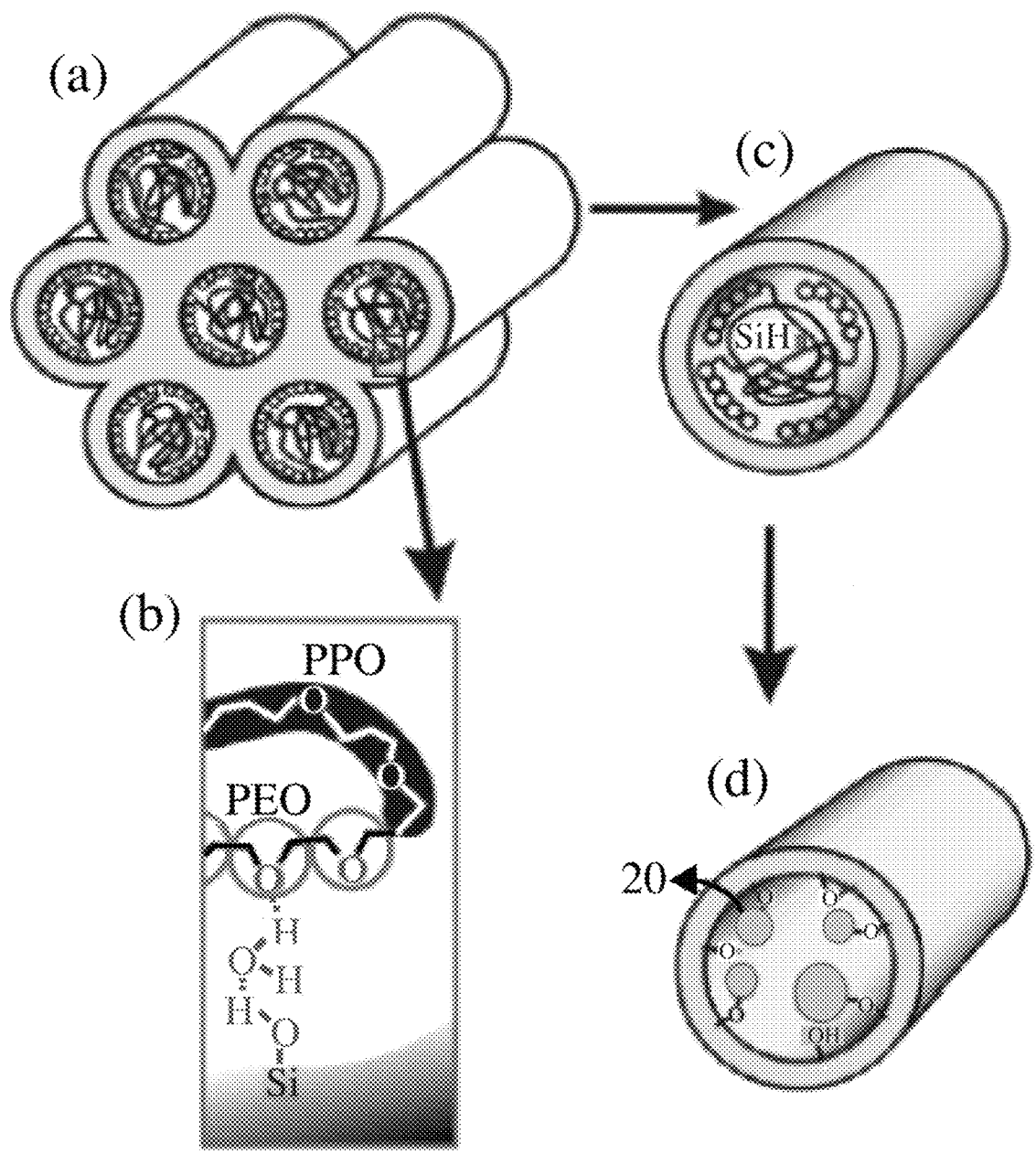
FIG. 2 is a schematic structure view showing a mesoporous frame of the embodiment of this disclosure.
Figure 3:
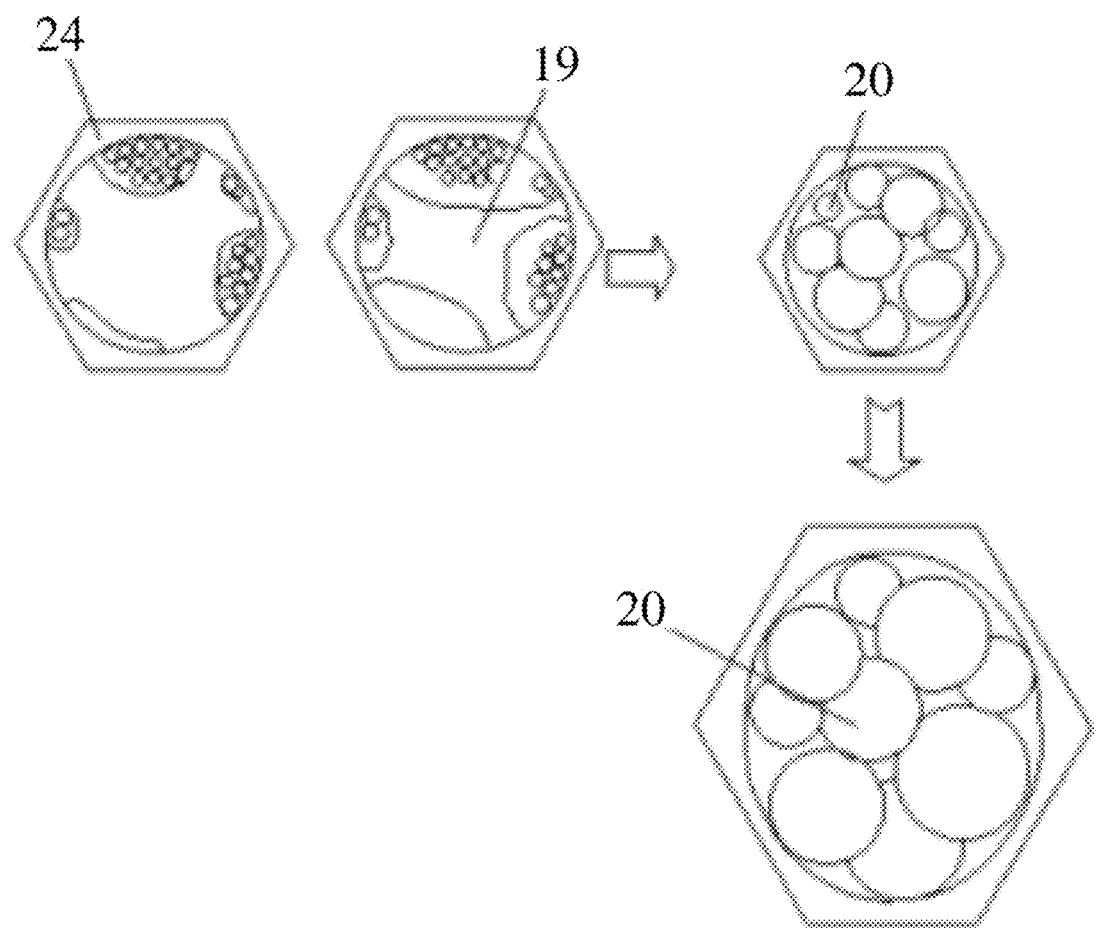
FIG. 3 is a schematic cross-section view showing the mesoporous frame of the embodiment of this disclosure.
Figure 5:
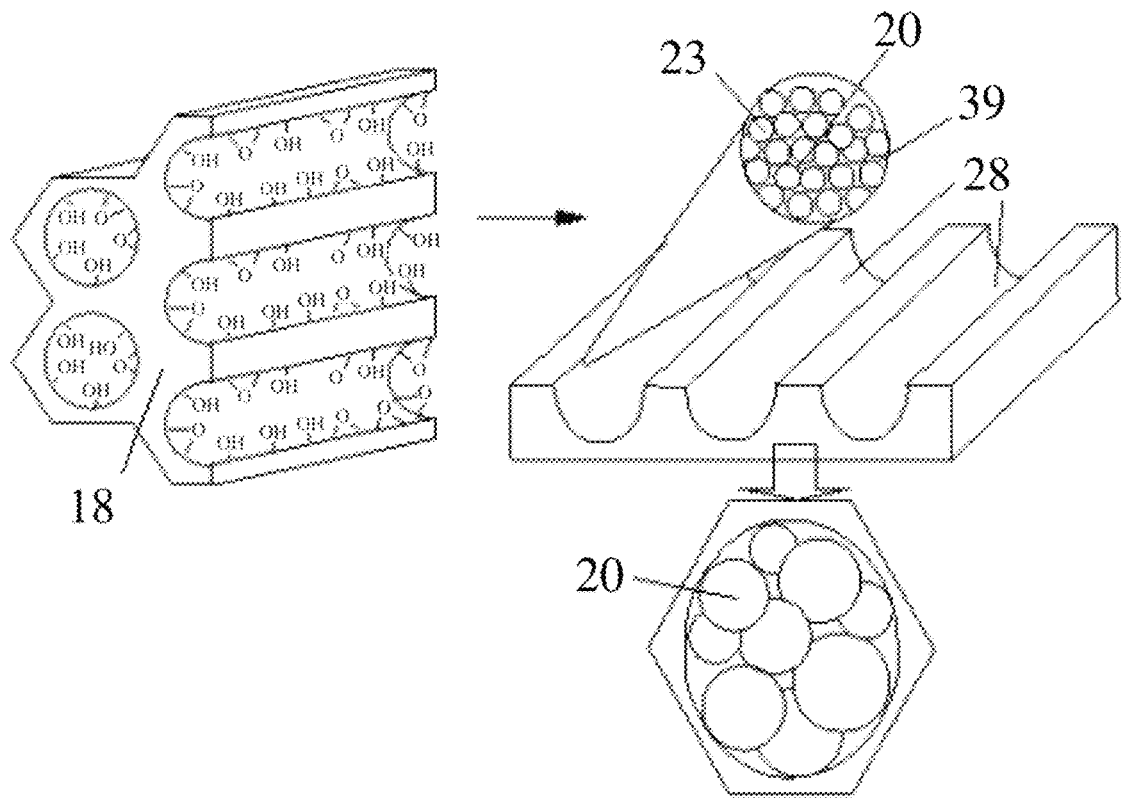
FIG. 5 is a schematic view showing an embodiment of this disclosure adopting a subject-object self-assembling molecule template assembling rule nanometer crystal.

The mesoporous frame is a self-assembling mesoporous silicon dioxide frame 18. Adopting the pore structure conveniently adopts the implementation of the self-assembling molecule template solution oxide. The self-assembling mesoporous silicon dioxide frame has the specific channel structure, has the hollow property, the small density and the large specific surface area, thus has the unique permeability, the molecule screening ability, the optical performance and the absorptivity, and can significantly improve trench properties. The self-assembling mesoporous silicon dioxide frame includes some cylindrical pores, the pores pass through the self-assembling mesoporous silicon dioxide frame 18, and the pores may be cylindrical, as shown in FIG. 2, and may also be polygonal, as shown in FIGS. 3 and 5. For example, the pores are arranged in the hexagonal rule, and the hexagonal rule arrangement can form a honeycomb-like structure, and has the good stability. Different manufacturing processes and product requirements can produce different shapes of the pore structures. Thus, various shapes of the pore structures are within the range of the idea of the present implementation method. The inner wall of the pore is a silicon dioxide hole wall 24. The diameter size of the pore ranges from 2 to 10 nanometers. The organic molecular template adopts a hollow structure, so that the nanometer crystal 23 can be more uniformly mixed with the self-assembling mesoporous silicon dioxide frame 18 to improve the electroconductive performance.

The organic molecular template has a very good shaping effect, so that the quantum dots are spread in the gap provided between the organic molecular template and an inner wall of the pore more uniformly. The radii of the quantum dots are smaller than or equal to the exciton Bohr radius. Since the radii are smaller than or equal to the exciton Bohr radius of the material, the quantum dots have the very significant quantum confinement effect. In the quantum dots with the smaller physical sizes, since the motion of the carriers in each direction is limited, the original continuous bandgap structure becomes the quasi-discrete level, the effective bandgap of the material is increased, and the photons with the higher energy and shorter wavelengths are further radiated. It is not difficult to see that with the continuous reduction of the physical size of the quantum point, the emitted spectrum of the quantum points of the same material can achieve the transition from red to blue light, and this also creates the most compelling property of quantum dots (i.e., the spectrum tunability). In addition, the emitted spectrum of the quantum dots has the narrower half peak width, and has a good color purity and color saturation. Also, the quantum dot is an inorganic semiconductor material, and has the environment stability that the organic chromophore cannot be matched. The material of the quantum dots is a silicon nanometer crystal material formed by mixing the organic molecular template, the hydrogen and the silicon tetrahydride together. In this manner, the self-assembling mesoporous silicon dioxide frame is used as the main body, regularly arranged pores of 2 to 10 nm can be adjusted and controlled, and the sizes and the arrangement uniformity of the quantum dots can be further controlled.

As shown in FIG. 1, the light-emitting diodes are disposed on a luminous layer 13, the luminous layer 13 includes a first luminous portion 14, a second luminous portion 15 and a third luminous portion 16. The first luminous portion 14, the second luminous portion 15 and the third luminous portion 16 may correspondingly output red, green and blue light, respectively. Of course, the luminous color is not restricted thereto. An active switch 12 may adopt a thin film transistor disposed and used. In the luminous process of the luminous layer in the display panel: a battery or power of the display panel applies a voltage on two ends of the luminous layer; a current flows from the second electrode to the first electrode, and flows through the quantum dot luminescent layer; the second electrode outputs electrons to an emissive layer; the first electrode absorbs electrons from a conductive layer (this can be regarded as the first electrode outputting holes to the conductive layer, and the two effects are equivalent); at the junction between the emissive layer and the conductive layer, the electrons combine with the holes; when the electrons meet the holes, they can fill the holes; when this process occurs, the electrons release energy in the form of photons; and the display panel emits the light. The electrons and holes are injected into the quantum dot luminescent layer through the electron transport layer and the hole transport layer, respectively, and thus form the exciton composite luminescence. This process is the direct injection of charges, it can effectively weaken the energy loss caused by the photoluminescence process, and it is beneficial to further enhance the luminous efficiency. Meanwhile, the solution method process having the low cost and prepared in large area can be used.

As another embodiment of this disclosure, each of the light-emitting diodes includes a first electrode, a quantum dot luminescent layer and a second electrode, wherein a process of the display panel includes the process steps of the luminous layer: providing material solutions of the first electrode, the quantum dot luminescent layer and the second electrode, which includes a material solution of the first electrode, a solution of the quantum dots and a material solution of the second electrode; depositing the first electrode material solution to form the first electrode; depositing the quantum dot solution on the first electrode to form the quantum dot luminescent layer; and depositing the second electrode material solution on the quantum dot luminescent layer to form the second electrode.

The quantum dot luminescent layer includes the mesoporous frame; and the quantum dots are disposed in the mesoporous frame. Since the quantum dots are disposed in the mesoporous frame, the sizes of the quantum dots and the uniformity of their arrangement are adjusted and controlled, the light-emitting diodes with different luminous colors depending on the sizes of the quantum dots are then adjusted. Thus, it is possible to realize the regulation uniformity of the light with different luminous colors in the active luminous display panel, and enhance the display taste and the user's visual experience.

The process also includes adopting solution processing to deposit a hole transport layer and an electron transport layer, wherein the hole transport layer is disposed between the first electrode (bottom electrode) and the quantum dot luminescent layer, and the electron transport layer is disposed between the quantum dot luminescent layer and the second electrode (top electrode). The solution processing is adopted to achieve the depositing, the solution processing includes, for example but without limitation to, spin coating, ink-jet printing, silk screen printing, pulling or ink-jetting. For example, regarding the vacuum depositing or vacuum heat evaporation, the organic substance molecules located in the vacuum chamber are slightly heated, and then these molecules are aggregated on the base layer having a lower temperature in the form of thin films. This method has a high cost and a low efficiency. Regarding the organic vapor deposition, the carrier gas transports the evaporated organic substance molecules to the low-temperature base layer in a low pressure hot wall reaction chamber, and then the organic substance molecules aggregate and condense into a film. Using the carrier gas can improve efficiency, and decrease the cost of the display panel. Regarding the ink-jet printing, the luminous layer can be sprayed onto the base layer using the ink-jet technology, and this is similar to the ink sprayed onto the sheet upon printing. The ink-jet technology greatly decreases the manufacturing cost of the display panel, and also prints the luminous layer onto the film having a very large surface area to produce the large display, such as an 80-inch large screen television or electronic billboard.

Figure 4:
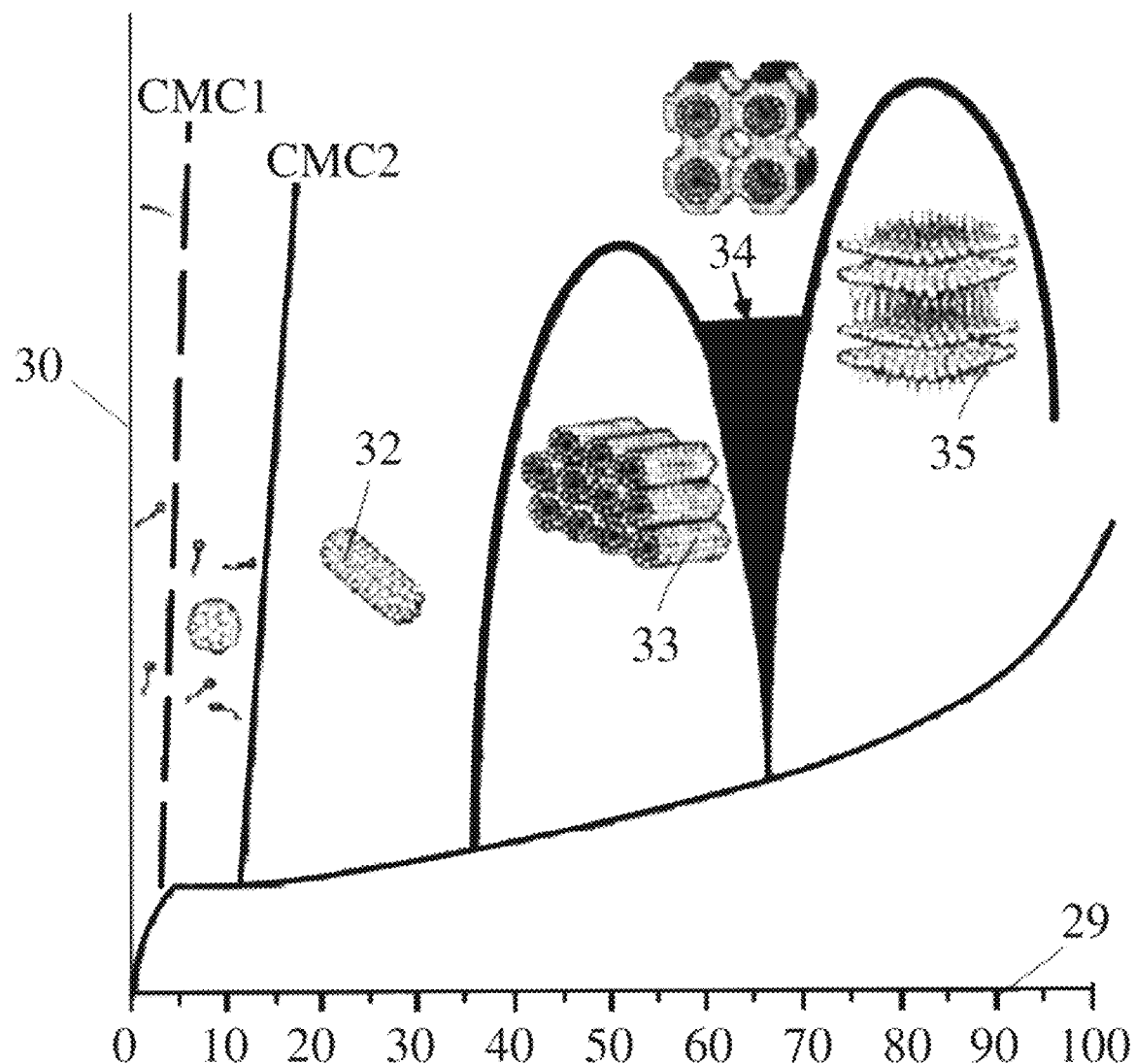
FIG. 4 is a schematic view showing a modification of a nanometer crystal of an embodiment of this disclosure.

As shown in FIG. 4, the concentration of the surfactant of the nanometer crystal in the quantum dot solution is adjusted to change the size of the quantum dot, and the temperature of the quantum dot solution is adjusted to change the size of the quantum dot. The abscissa represents the concentration of the surfactant of the nanometer crystal (surfactant concentration with the unit of weight percentage) 29, and the ordinate represents the centigrade temperature 30. CMC 1 and CMC 2 is the abbreviation for the two critical micelle concentrations. The curve successively undergoes the micellar phase 32, the hexagonal liquid crystal state 33, the cubic shape 34 and the lamellar liquid crystal state 35. The general processes includes: forming micelles; forming the micelles into micelle bars; arranging the micelle bars in a hexagonal form to form a hexagonal array; forming the hexagonal array into a template intermediate group according to the organic molecular template self-assembly mechanism; and cultivating the template intermediate group to remove the template to form a silicon dioxide frame. The hexagonal array consisting of micelle bars is used as the template, the template itself is both a styling agent and a stabilizer, and the expected regulation of the material structure can be achieved by changing the shape and size thereof. In addition, the experimental device is simple and easy to operate. The micelle bars can be reused to reduce the waste, and is beneficial to the decreases of the cost and the environmental pollution.

Figure 6:
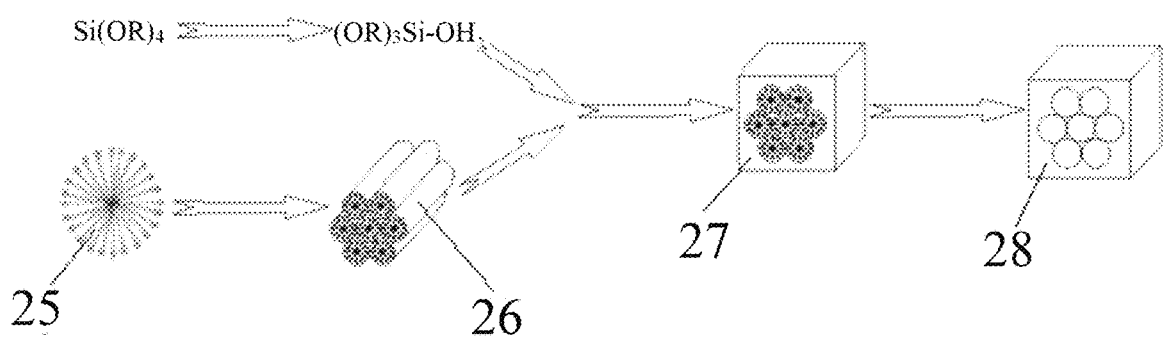
FIG. 6 is a schematic view showing a self-assembling mesoporous silicon dioxide frame technology of an embodiment of this disclosure.

As shown in FIG. 6, a sol-gel method is adopted to convert the inorganic compound $Si(OR)_4$ into $Si(OR)_3Si$—OH. On the other hand, the surfactant micelles 25 are arranged in a hexagonal matrix 26 by the self-assembling technology, the micelles of the hexagonal matrix 26 and $Si(OR)_3Si$—OH are self-assembled by the co-assembly technology to form the organic/inorganic hybrid microstructure material 27, and then form the mesoporous material 28 by way of drying and burning.

As still another embodiment of this disclosure, the display device includes a backlight module and the above-mentioned display panel. As shown in FIG. 1, the backlight module includes a polarizer 22 disposed on the outside of the substrate. The display panel includes a substrate 11 and light-emitting diodes formed on the substrate 11. Each of the light-emitting diodes includes a first electrode, a quantum dot luminescent layer and a second electrode. The first electrode, the quantum dot luminescent layer and the second electrode are stacked in order, and the quantum dot luminescent layer includes a mesoporous frame. The mesoporous frame adopts a self-assembling form, the mesoporous frame serves as a main material, and quantum dots 20 are disposed in the mesoporous frame. Since the quantum dots are disposed in the mesoporous frame, the sizes of the quantum dots and the uniformity of their arrangement are adjusted and controlled, the light-emitting diodes with different luminous colors depending on the sizes of the quantum dots are then adjusted. Thus, it is possible to realize the regulation uniformity of the light with different luminous colors in the active luminous display panel, and enhance the display taste and the user's visual experience. The display panel includes the active switches 12, and the active switches 12 are disposed between the substrate 11 and the light-emitting diodes; and the display panel includes a vacuum layer 17 and a sealing portion 21, the sealing portion 21 and the light-emitting diode cooperate with each other to form the vacuum layer 17, and the vacuum layer 17 is disposed on the light-emitting diode. A pore is formed in the mesoporous frame, an organic molecular template 19 is disposed inside the pore, and a gap is formed between the organic molecular template 19 and an inner wall of the pore; and the quantum dots 20 are disposed in the gap. The organic molecular template has a very good shaping effect, so that the quantum dots are spread in the gap provided between the organic molecular template and an inner wall of the pore more uniformly. The radii of the quantum dots are smaller than or equal to the exciton Bohr radius. Since the radii are smaller than or equal to the exciton Bohr radius of the material, the quantum dots have the very significant quantum confinement effect. The material of the quantum dots is a silicon nanometer crystal material formed by mixing the organic molecular template, the hydrogen and the silicon tetrahydride together.

As shown in FIG. 1, the light-emitting diodes are disposed on a luminous layer 13, the luminous layer 13 includes a first luminous portion 14, a second luminous portion 15 and a third luminous portion 16. The first luminous portion 14, the second luminous portion 15 and the third luminous portion 16 may correspondingly output red, green and blue light, respectively. Of course, the luminous color is not restricted thereto. An active switch 12 may adopt a thin film transistor disposed and used. In the luminous process of the luminous layer in the display panel: a battery or power of the display panel applies a voltage on two ends of the luminous layer; a current flows from the second electrode to the first electrode, and flows through the quantum dot luminescent layer; the second electrode outputs electrons to an emissive layer; the first electrode absorbs electrons from a conductive layer (this can be regarded as the first electrode outputting holes to the conductive layer, and the two effects are equivalent); at the junction between the emissive layer and the conductive layer, the electrons combine with the holes; when the electrons meet the holes, they can fill the holes; when this process occurs, the electrons release energy in the form of photons; and the display panel emits the light. The electrons and holes are injected into the quantum dot luminescent layer through the electron transport layer and the hole transport layer, respectively, and thus form the exciton composite luminescence. This process is the direct injection of charges, it can effectively weaken the energy loss caused by the photoluminescence process, and it is beneficial to further enhance the luminous efficiency. Meanwhile, the solution method process having the low cost and prepared in large area can be used.

Figure 7:
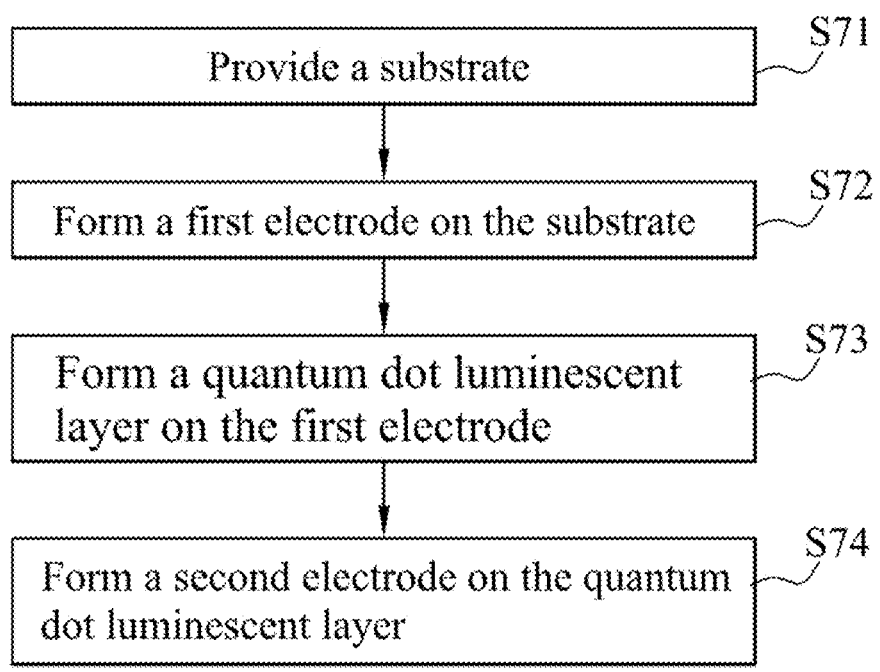
FIG. 7 is a schematic view showing a manufacturing method of the display panel of an embodiment of this disclosure.

Referring to FIG. 7, the present disclosure also provides a method of manufacturing a display panel, comprising steps of: providing a substrate (S71); forming a first electrode on the substrate (S72); forming a quantum dot luminescent layer on the first electrode (S73); and forming a second electrode on the quantum dot luminescent layer (S74).

Figure 8:
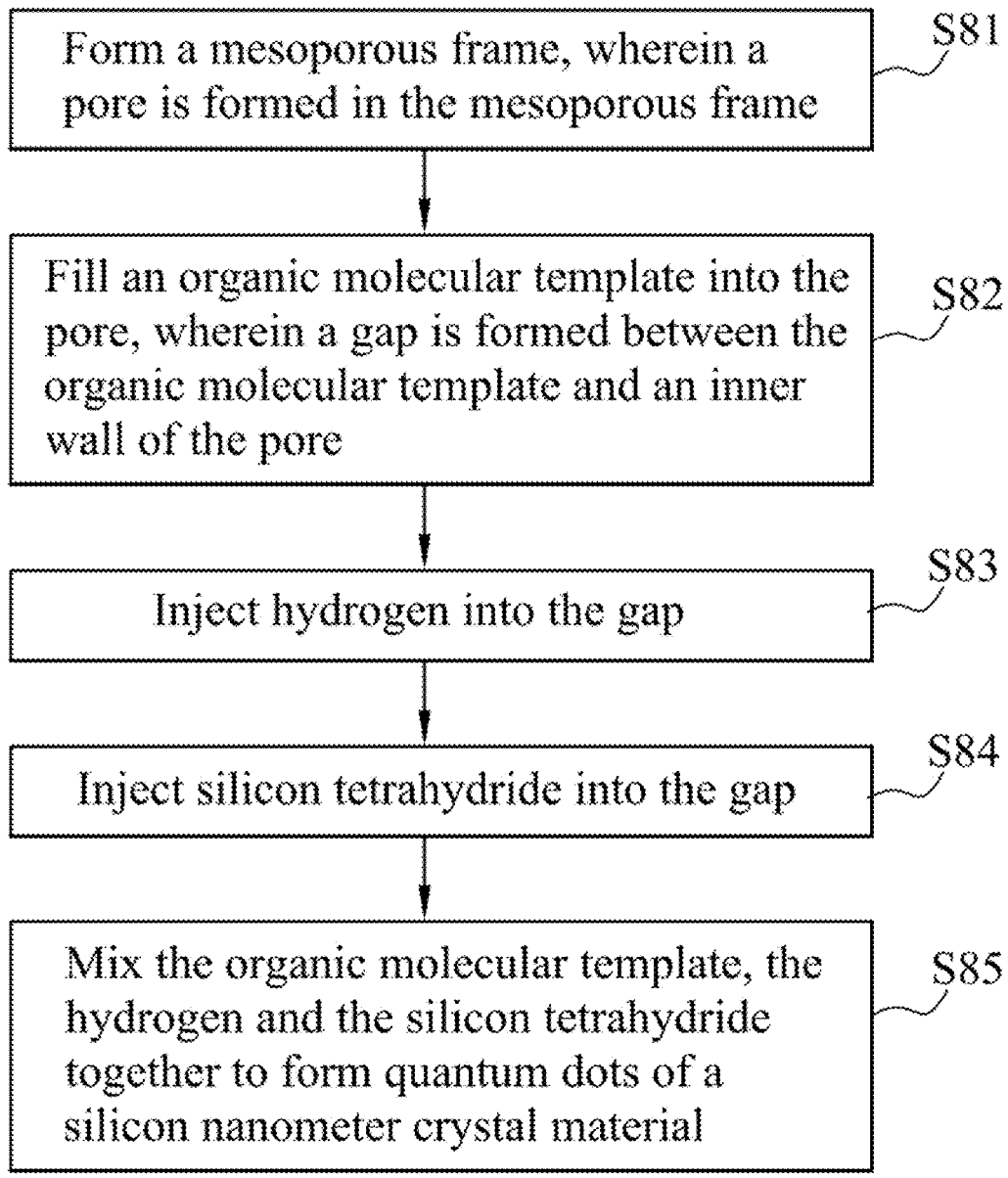
FIG. 8 is a schematic view showing a manufacturing method of a quantum dot luminescent layer of an embodiment of this disclosure.

Referring to FIG. 8, the step of forming the quantum dot luminescent layer on the first electrode comprises: forming a mesoporous frame, wherein a pore is formed in the mesoporous frame (S81); filling an organic molecular template into the pore, wherein a gap is formed between the organic molecular template and an inner wall of the pore (S82); injecting hydrogen into the gap (S83); injecting silicon tetrahydride into the gap (S84); and mixing the organic molecular template, the hydrogen and the silicon tetrahydride to form quantum dots of a silicon nanometer crystal material (S85).

It is to be described that the material of the substrate may be selected from glass, plastic and the like in the above-mentioned embodiment.

In the above embodiments, the display panel is a QLED (Quantum Dot Light Emitting Diodes) display panel.

In the above embodiments, the liquid crystal panel of the disclosure can be a curved panel.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of manufacturing a display panel, comprising steps of:
   providing a substrate;
   forming a first electrode on the substrate;
   forming a quantum dot luminescent layer on the first electrode; and
   forming a second electrode on the quantum dot luminescent layer;
   the step of forming the quantum dot luminescent layer on the first electrode comprises:
   forming a mesoporous frame, wherein the mesoporous frame adopts a self-assembling form, the mesoporous frame serves as a main material, and a pore is formed in the mesoporous frame;
   filling an organic molecular template into the pore, wherein a gap is formed between the organic molecular template and an inner wall of the pore;
   injecting hydrogen into the gap; and
   injecting silicon tetrahydride into the gap;
   wherein the organic molecular template, the hydrogen and the silicon tetrahydride are mixed to form quantum dots of a silicon nanometer crystal material.

2. The method according to claim 1, wherein the step of forming the first electrode, the quantum dot luminescent layer and the second electrode adopts solution processing.

3. The method according to claim 2, wherein the step of forming the first electrode, the quantum dot luminescent layer and the second electrode comprises:
   depositing a first electrode material solution to form the first electrode;
   depositing a quantum dot solution to form the quantum dot luminescent layer; and
   depositing a second electrode material solution to form the second electrode.

4. The method according to claim 1, wherein radii of the quantum dots are smaller than or equal to an exciton Bohr radius.

5. The method according to claim 1, wherein a diameter of the pore ranges from 2 to 10 nanometers.

6. The method according to claim 1, wherein a light-emitting diode comprises the first electrode, the quantum dot luminescent layer and the second electrode, the display panel further comprises a vacuum layer and a sealing portion, the sealing portion and the light-emitting diode cooperate with each other to form the vacuum layer, and the vacuum layer is disposed on the light-emitting diode.

* * * * *